United States Patent [19]

Chiao

[11] Patent Number: 5,540,884
[45] Date of Patent: Jul. 30, 1996

[54] METHOD OF MAKING CO-FIRED, MULTILAYER SUBSTRATES

[75] Inventor: Yi-Hung Chiao, Midland, Mich.

[73] Assignee: The Dow Chemical Company, Midland, Mich.

[21] Appl. No.: 190,088

[22] PCT Filed: Aug. 31, 1992

[86] PCT No.: PCT/US92/07384

§ 371 Date: Nov. 7, 1994

§ 102(e) Date: Nov. 7, 1994

[87] PCT Pub. No.: WO93/04998

PCT Pub. Date: Mar. 18, 1993

[51] Int. Cl.⁶ .................................................. C04B 35/58
[52] U.S. Cl. .................................. 419/47; 419/5; 419/57; 428/551; 501/96
[58] Field of Search ............................ 419/5, 47, 57; 428/551; 501/96

[56] References Cited

U.S. PATENT DOCUMENTS

| | | | |
|---|---|---|---|
| 3,399,076 | 4/1965 | Ginsberg et al. | 427/123 |
| 3,637,117 | 6/1972 | Schroeder et al. | 106/1.15 X |
| 3,637,435 | 12/1972 | Schwyn et al. | 427/123 |
| 3,922,387 | 11/1975 | Larry | 427/96 |
| 4,618,592 | 10/1986 | Kuramoto et al. | 501/96 |
| 4,626,451 | 12/1986 | Tanaka et al. | 427/123 |
| 4,678,683 | 7/1987 | Pasco | 427/123 |
| 4,766,097 | 8/1988 | Shinozaki et al. | 501/96 X |
| 4,770,953 | 9/1988 | Horiguchi | 501/96 X |
| 4,778,549 | 10/1988 | Cowan | 427/96 X |
| 4,818,626 | 4/1989 | Werdecker et al. | 427/96 X |
| 4,843,038 | 6/1989 | Kuratani et al. | 501/96 |
| 4,843,042 | 6/1989 | Dole et al. | 501/96 |
| 4,847,221 | 7/1989 | Horiguchi et al. | 501/96 |
| 4,877,760 | 10/1989 | Okuno | 501/96 |
| 4,883,780 | 11/1989 | Kasori et al. | 501/96 |
| 4,892,848 | 1/1990 | Yoshida et al. | 501/96 |
| 4,897,372 | 1/1990 | Huseby et al. | 501/96 |
| 4,963,187 | 10/1990 | Kondo et al. | 106/1.13 X |
| 4,997,798 | 3/1991 | Okuno et al. | 501/98 |
| 5,045,400 | 9/1991 | Esashi | 428/450 |
| 5,062,891 | 11/1991 | Gruber | 106/1.13 X |
| 5,063,121 | 11/1991 | Sato | 501/96 |
| 5,102,720 | 4/1992 | Raj | 421/209 |
| 5,198,885 | 3/1993 | Ibrahim | 257/701 |
| 5,200,249 | 4/1993 | Dolhert et al. | 428/137 |
| 5,294,388 | 3/1994 | Shimoda et al. | 264/65 |

FOREIGN PATENT DOCUMENTS

| | | | |
|---|---|---|---|
| 0598364 | 5/1960 | Canada | 156/89 |
| 235682 | 2/1987 | European Pat. Off. . | |
| 0235682 | 2/1987 | European Pat. Off. . | |
| 329973 | 8/1989 | European Pat. Off. . | |
| 2254477 | 11/1971 | Germany | 427/96 |
| 0033752 | 9/1978 | Japan | 106/1.14 |
| 101008 | 3/1986 | Japan . | |
| 1048494 | 3/1986 | Japan | 427/96 |
| 62-256772 | 11/1987 | Japan . | |
| 03146487 | 6/1991 | Japan . | |

OTHER PUBLICATIONS

Yasuhiro Kurokawa et al. "Highly Thermal Conductive AlN Substrate", *NEC Res Dev*, 85, pp. 15–21, (Apr. 1987).

Yasuhiro Kurokawa et al. "Characterization of the AlN-W Interface in a cofired Multilayer AlN Substrate", *Journal of the American Ceramic Society*, 72[4] pp. 612–616 (1989).

Yasuhiro Kurokawa et al. "Development of Highly Thermal Conductive AlN Substrate By Green Sheet Technology", *Proc–Electron. Compon. Conf.*, 36, pp. 412–418 (1986).

Nobuyuki Kuramoto "Translucent AlN Ceramic Substrate", *IEEE Trans. Compon Hybrids. Manuf. Technol.*, CHMT–9(4), pp. 386–390, (1986).

Chem Abstracts, vol 115, No 20.

Primary Examiner—Charles T. Jordan
Assistant Examiner—Daniel J. Jenkins

[57] ABSTRACT

Heat multilayer aluminum nitride greenware, a composite of layers of aluminum nitride green tape having refractory metal ink patterns deposited thereon, in a nonoxidizing atmosphere, at atmospheric pressure to effect liquid phase sintering of both the aluminum nitride greenware and the refractory metal ink. The resultant cofired structure is substantially free of warpage and has satisfactory thermal conductivity, surface finish, mechanical properties and resistance to delamination.

12 Claims, No Drawings

METHOD OF MAKING CO-FIRED, MULTILAYER SUBSTRATES

The present invention generally concerns preparing co-fired, multilayer substrates with little or no discernable warpage. The present invention more particularly concerns preparing such structures by liquid phase sintering. The present invention still more particularly concerns preparing co-fired, multilayer aluminum nitride (AlN) substrates wherein at least a portion of the layers have conductive, refractory metal paste patterns deposited thereon.

Yasuhiro Kurokawa et al., in "Characterization of the AlN—W Interface in a Cofired Multilayer AlN Substrate", *Journal of the American Ceramic Society*, 72[4] pages 612–16 (1989), characterize the structure and chemistry of the AlN—W interface. They laminate tape-cast AlN green sheets screen-printed with tungsten thick-film paste to prepare a multilayer structure. The AlN sheets contain two weight percent calcium carbide ($C_aC_2$) as a sintering aid. The tungsten paste contains 3 weight percent (wt. % AlN powder to make the fired shrinkage of the tungsten close to that of the AlN. They fire the laminate at 1900° C. under 0.1 megapascal (MPa) nitrogen gas for 4 hours (hrs). The sintering conditions employed by Kurokawa et al. approach those used in solid phase sintering.

European Patent Application 329,973 describes a number of problems encountered in attempting to produce electronic substrates by pressureless sintering. One problem is uneven sintering due to inhomogeneities in green ceramic sheets or uneven heating thereof. Uneven sintering can, in turn, lead to warping in the fired product. A second problem is that AlN is difficult to sinter. This can lead to insufficiently high sintered densities. A third problem is an inability to control lateral shrinkage during sintering of both the metal and ceramic layers. This can result in substantial residual stresses between layers, warpage or delamination of the substrate. and failure to meet required dimensional tolerances.

European Patent Application 329,973 proposes to solve the aforementioned problems by hot pressing ceramic green sheets containing ceramic powder and organic binders that leave no undesirable residue upon pyrolysis in the absence of oxygen. Boron nitride (BN) sheets made of BN powder in a similar binder are placed on each side of the ceramic green sheet to form a composite. The BN sheets are subsequently removed. Multilayer ceramic electronic substrates with internal interconnections between metal circuits deposited on various green sheets by conventional methods, such as screen printing, may also be produced by hot pressing.

One aspect of the present invention is a method of preparing a cofired, multilayer aluminum nitride substrate that is substantially free of warpage or delamination, the method comprising:

a. preparing at least two ceramic green sheets from a composition containing aluminum nitride, a combination of at least one first liquid phase sintering aid and at least one second liquid phase sintering aid, and, optionally, aluminum oxide ($Al_2O_3$), the first and second sintering aids being selected from subgroups 1) oxygen-containing alkaline earth metal compounds, 2) oxygen-containing derivatives of lanthanide series elements, 3) oxygen-containing derivatives of yttrium, 4) alkaline earth metal halides, 5) halogen-containing derivatives of lanthanide series elements and 6) yttrium halides, provided, however, that the first and second sintering aids are selected from different subgroups, the combination of sintering aids being present in an amount sufficient to initiate liquid phase sintering of aluminum nitride at a temperature within a range of from 1400° C. to 1600° C. and substantially complete said liquid phase sintering at a temperature within a range of from 1600° C. to 1900° C.;

b. depositing a desired pattern of conductive metal paste on at least one major planar surface of at least one ceramic green sheet, the metal paste containing a refractory metal and at least one sintering additive selected from the group consisting of nickel (Ni), cobalt (Co), chromium (Cr), iron (Fe), manganese (Mn), copper (Cu) and compounds thereof that are converted to their corresponding metal during sintering, the sintering additive(s) being present in an amount sufficient to initiate liquid phase sintering of the refractory metal at a temperature within a range of from 1400° C. to 1600° C. and substantially complete said liquid phase sintering at a temperature within a range of from 1600° C. to 1900° C.;

c. preparing a laminate of a desired number of ceramic green sheets having conductive metal patterns deposited thereon;

d. heating the laminate in a non-oxidizing atmosphere, at atmospheric pressure and at a temperature sufficient to effect liquid phase sintering of both the ceramic sheets and the conductive metal paste deposited on said sheets. As an alternative, heating may take place in a vacuum or under pressure rather than at atmospheric pressure.

A second aspect of the present invention is a liquid-phase sinterable, conductive metal paste composition comprising a refractory metal and at least one sintering additive selected from Ni, Co, Cr, Fe, Mn, Cu and compounds thereof that are converted to their corresponding metal during sintering, the sintering additive(s) being present in a total amount sufficient to initiate liquid phase sintering of the refractory metal at a temperature within a range of from 1400° C. to 1600° C. and substantially complete said liquid phase sintering at a temperature within a range of from about 1600° C. to 1900° C.

An initial step in the process of the invention involves preparing at least two green or unfired ceramic sheets. The sheets can be produced using standard procedures such as extrusion, injection molding or tape casting. Tape casting using a suitable ceramic slip composition yields satisfactory green sheets.

The slip, or ceramic/polymer slurry beneficially contains AlN, liquid phase sintering aids, at least one organic binder, a dispersant, a solvent and, optionally, a plasticizer or lubricant. Satisfactory slip compositions comprise from 50 to 70 wt. % ceramic materials, from 5 to 15 wt. % binder material and from 20 to 45 wt. % o solvent, all percentages being based upon slip weight. The ceramic materials consist of AlN and the liquid phase sintering additives. The binder material consists of binder, polymeric dispersants, lubricants and plasticizers.

Slip composition components other than the ceramic materials are selected based upon two primary criteria. First, the slip composition must yield a green sheet that can be handled easily during assembly of a multilayer substrate prior to subjecting the substrate to sintering conditions. Second, components other than the ceramic materials must be removed during heating of the multilayer substrate without leaving undesirable residues to contaminate or interfere with properties of aluminum nitride after sintering.

Dried tapes are suitably cut, sheared or otherwise fabricated into shapes having desired dimensions by conventional means such as a blanking die. Registration holes for alignment and via holes for interconnecting metal circuits can be punched at the same time.

The AlN may be prepared either by carbothermal reduction or direct nitridation so long as it meets certain criteria. It should be in the form of a fine powder that is substantially free of hard agglomerates. Agglomerates tend to interfere with forming and casting ceramic slips. An ultimate particle size of from 0.5 to 2.0 micrometers ($\mu$m) provides satisfactory results. The ultimate particle size is desirably about 1 $\mu$m. The particle size distribution should also be narrow. Satisfactory results are obtained when the particle size distribution provides a surface area within a range of from 2 to 6 $m^2$/gram. The AlN should also be of high purity. A typical high purity powder has an oxygen content of $\leq 1$ wt. %, a carbon content of $\leq 0.1$ wt. %, and a total of metallic impurities, such as silicon (Si) and iron (Fe), of $\leq 0.1$ wt. %. The foregoing weight percentages are based upon total powder weight. Commercially available "electronic grade" AlN powders typically meet these criteria and produce acceptable results.

AlN does not sinter easily in the absence of sintering aids. The present invention employs combinations of at least one first liquid phase sintering aid, at least one second liquid phase sintering aid and, optionally, $Al_2O_3$ to facilitate sintering of the AlN. The liquid phase sintering aids are suitably selected from two different subgroups. The subgroups are: 1) oxygen-containing alkaline earth metal compounds; 2) oxygen-containing derivatives of lanthanide series elements; 3) oxygen-containing derivatives of yttrium; 4) alkaline earth metal halides; 5) halogen-containing derivatives of lanthanide series elements; and 6) yttrium halides. The alkaline earth metals are suitably calcium (Ca), barium (Ba), strontium (Sr) and radium (Ra), beneficially Ca or Ba. The halides are suitably fluorides. The oxygen-containing alkaline earth metal compound is desirably calcium oxide (CaO), calcium carbonate ($CaCO_3$) or calcium nitrate, preferably $CaCO_3$. The alkaline earth metal halide is desirably calcium fluoride ($CaF_2$) or barium fluoride ($BaF_2$). The lanthanide series elements are desirably cerium (Ce) and dysprosium (Dy). Cerium fluoride is a preferred halogen-containing derivative of a lanthanide series element. Dysprosium oxide ($Dy_2O_3$) is a preferred oxygen-containing derivative of a lanthanide series element. Yttrium oxide ($Y_2O_3$) and yttrium nitrate are preferred oxygen-containing derivatives of yttrium. Yttrium fluoride ($YF_3$) is a preferred yttrium halide. Compounds that are converted, during sintering, to the aforementioned sintering aids may also be used.

Combinations of sintering aids which produce satisfactory results include $CaF_2$, $CaCO_3$ and $Al_2O_3$; $Y_2O_3$, $YF_3$ and $Al_2O_3$; $YF_3$, $CaF_2$ and $Al_2O_3$; $Y_2O_3$, $CaCO_3$ and $Al_2O_3$; $CaF_2$ and $YF_3$; $CaCO_3$ and $YF_3$; $CaF_2$ and $Y_2O_3$; and $CaF_2$, CaO and $Al_2O_3$. The combination of sintering aids is beneficially present in an amount sufficient to initiate liquid phase sintering of AlN at a temperature within a range of from 1400° C. to 1600° C. and substantially complete said liquid phase sintering at a temperature within a range of from 1600° C. to 1900° C. Liquid phase sintering is beneficially complete at a temperature within a range of from 1600° C. to 1750° C. The latter temperature range is desirably from 1600° C. to 1700° C.

Aluminum oxide, when present, is suitably present in an amount sufficient to promote liquid phase sintering within the aforementioned temperature ranges. The amount of $Al_2O_3$, when present, is beneficially from greater than 0 to 8 wt. %, based upon weight of AlN plus sintering aids. The amount of $Al_2O_3$ is desirably from 0.1 to 2 wt. %.

Organic binders suitable for use in preparing AlN slip formulations include those conventionally used to prepare ceramic green sheets. The organic binders should promote preparation of flexible green sheets and readily pyrolyze without leaving an undesirably high level of residual carbon. A preferred level of residual carbon after "binder burnout", or heating to volatilize organic components, is less than 0.4 wt. %, based upon ceramic sheet weight. Larger amounts can be tolerated provided sufficient $Al_2O_3$ or other oxygen-containing sintering aid is present to offset the excess and promote reduction of the carbon content through formation of carbon monoxide. Organic binders that provide satisfactory results include polyvinylbutyral, polymers of acrylic or methacrylic acid (also known as acrylate and methacrylate resin), polyvinyl alcohol and polyethylene. The binder is suitably polyvinyl butyral or an acrylic resin. The organic binder may be used in conjunction with other organic compounds, such as polyalkylene glycol, that are added to slip formulations as viscosity modifiers. They also promote flexibility of ceramic green sheets during handling to prepare laminates for sintering.

Solvents used in preparing aluminum nitride slip formulations are suitably selected from ortho-xylene, ethanol, toluene, methyl ethyl ketone, trichloroethylene, methanol and combinations thereof. Other conventional solvents may also be used.

Plasticizers used in preparing AlN slip formulations include conventional plasticizers such as alkyl phthalate, dibutyl phthalate, polyethylene glycol and combinations thereof.

In step two of the process, a desired pattern of conductive metal paste is deposited on at least one major planar surface of at least one ceramic green sheet. The pattern may be applied using conventional techniques such as screen printing.

The metal paste comprises a refractory metal and at least one metallic sintering additive selected from the group consisting of Ni, Co, Cr, Fe, Mn and Cu. The metallic sintering additive is desirably Ni, Co or Cu. The sintering additives are suitably present in an amount sufficient to initiate liquid phase sintering of the refractory metal at a temperature within a range of from 1400° C. to 1600° C. The amount is beneficially sufficient to allow substantial completion of said liquid phase sintering at a temperature within a range of from 1600° C. to 1900° C.

Satisfactory results are obtained with refractory metal paste compositions comprising from 60 to 89.5 wt. % metal, from 0.5 to 10 wt. % polymeric binder and from 10 to 30 wt. % organic solvents. All percentages are based upon paste weight. The metal component consists of the refractory metal and sintering additives for the refractory metal. The sintering additives comprise from greater than 0 to 10 wt. % of the metal component. The metal paste composition, although particularly suitable for use with AlN, may be used with other ceramic materials such as $Al_2O_3$.

The refractory metal is suitably selected from the group consisting of tungsten (W), molybdenum (Mo) or tantalum (Ta), and combinations thereof. The refractory metal is desirably W or Mo, preferably W. The tungsten beneficially has an average particle size within a range of from 0.5 to 2.5 $\mu$m. The average particle size is desirably from 0.5 to 1.5 $\mu$m.

The refractory metal paste may further comprise a binder and a solvent. The binder is suitably selected from cellulose ethers, particularly ethyl cellulose; polyvinylbutyral; acrylic resins; methacrylic resins; and combinations thereof. The binder is present in an amount sufficient to impart pseudoplastic flow to the paste as it is deposited upon substrate surfaces or into vias or both by procedures such as screen printing. The amount must not be so large, however, that it cannot be substantially removed during further processing. Satisfactory results are obtained with amounts of binder within a range of from 1 to 5 wt. %, based upon paste weight. The solvent is suitably capable of placing the binder in solution. Terpineol suffices when the binder is ethyl cellulose or polyvinylbutyral. Ethanol or ortho-xylene may be used with polyvinylbutyral.

Interconnections between circuits resulting from sintering of the metal paste patterns may be effected by standard technology. By way of illustration, via holes may, prior to deposition or refractory metal paste thereon, be filled either with metal powder, metal paste or with plugs punched from a metal powder-loaded ceramic green sheet. The latter sheets are prepared in the same manner as the green ceramic sheets save for incorporation of a suitable amount of metal powder. A more common approach to filing via holes employs either vacuum-assisted screen printing or injection.

Step three of the process involves preparing a laminate of a desired number of ceramic green sheets having conductive metal patterns deposited thereon. Such sheets may also be referred to as metallized green sheets. The pattern formed from conductive metal paste is desirably dried prior to laminate preparation. The laminate may be formed by any suitable conventional technique. One such technique includes stacking the metallized green sheets in a lamination die and thereafter subjecting the stack to thermal compression, for example, at a pressure of 1000 pounds per square inch (psi) (6.9 MPa) and a temperature of 80° to 90° C. for a period of five minutes.

In step four of the process, the laminate is heated in a non-oxidizing atmosphere, at atmospheric pressure and at a temperature sufficient to effect liquid phase sintering of both the ceramic sheets and the conductive metal paste deposited on said sheets.

The process desirably comprises an intermediate step between steps three and four wherein the laminate is heated in a non-oxidizing atmosphere at a temperature and for a time sufficient to volatilize or pyrolyze substantially all organic components of the laminate.

The resultant co-sintered, multilayer substrates exhibit good surface finish and flatness, very satisfactory interfacial bonding, near theoretical densities and thermal conductivity values in excess of 100 watts/meter degree Kelvin (W/m °K.).

The following examples illustrate, but do not limit, the scope of the present invention. All parts and percentages are by weight unless otherwise stated.

EXAMPLE 1

General Procedure for Fabricating Substrates

A slurry or slip suitable for use in fabricating thin AlN sheets via tape casting was prepared by blending electronic grade AlN (produced by The Dow Chemical Company) with one or more sintering aids, one or more solvents, one or more dispersants, one or more plasticizers, one or more binders and, optionally, one or more lubricants. The slurry components, less the lubricants, plasticizers and binders, were milled at room temperature for a period of 2 to 3 hours with AlN milling media (right circular cylinders having a diameter of ½ inch (1.3 cm) and a length of ½ inch (1.3 cm)) in a plastic milling jar. The amount of milling media was sufficient to provide weight ratio of milling media to aluminum nitride powder of 3:2. The binders, plasticizers and lubricants were then added and milling continued for an additional period of 16 hours to provide a milled slip. The milled slip was filtered through a nylon cloth having a 74 μm mesh size.

The filtered slip was cast as a wet tape onto a silicone-coated polyester carrier film using a doctor blade. The cast tape was typically twice the thickness desired for a dried tape and ranged from 5 to 15 mils (127 to 381 μm). The cast tape thickness was typically about 10 mils (254 μm). The cast tape was dried at room temperature under forced air circulation for a period of 3 hours. The dried tapes were separated from the carrier film and cut into shaped pieces using a shear die. If desired, registration holes for alignment purposes and via holes for interlayer circuit connections were drilled or punched into the shaped pieces.

For multilayer structures, a number of shaped pieces were stacked together in a lamination die and compressed under a pressure of 1,000 psi (6.9 MPa) at a temperature of 90° C. for a period of 5 minutes. The compressed pieces were removed from the lamination die and placed in a burnout oven to remove polymeric binder materials. A typical burnout schedule included heating at a temperature of 600° C. under flowing nitrogen for a period of 4 hours followed by cooling at a rate of about 2° C. per minute.

After binder burnout, the pieces were placed on a boron nitride or refractory metal tray or crucible and loaded into a high temperature sintering furnace. The pieces were heated, in the presence of gaseous nitrogen flowing at a rate of 3 standard cubic feet per hour (23.6 cm$^3$/sec) to a sintering temperature. Heating occurred at a rate of 10° C./minute from 20° C. to 1400° C. and at a rate of 2°–5° C./minute from 1400° C. to a desired sintering temperature. The desired sintering temperatures were within a range of 1600°–1900° C. The heated pieces were maintained at the sintering temperature for a period of 4 hours and then cooled at a rate of 5° C. per minute to room temperature. The sintered pieces were tested for thermal conductivity by the laser flash method. See, W. J. Parker, R. J. Jenkins, C. P. Butler and G. L. Abbott, "Flash Method of Determining Thermal Diffusivity, Heat Capacity and Thermal Conductivity", *Journal of Applied Physics*, 32, 1679–84 (1961). See also, R. C. Enck, R. D. Harris and R. A. Youngman, "Measurement of the Thermal Diffusivity of Translucent Aluminum Nitride", *Advanced Characterization Techniques for Ceramics, Ceramics Transactions*, vol 5, 218–22 (1989).

Table I provides three organic formulations that were used to prepare slip compositions. Table II lists the sintering additive and slurry formulations that were used in preparing samples 1–10. Sintered pieces were prepared from these slip formulations using the foregoing general procedure. Table III reports the sintering temperature and summarizes results of thermal conductivity testing.

TABLE I

Organic Component Formulations*

| Component | Generic Description | Composition | | |
|---|---|---|---|---|
| | | A | B | C |
| Dispersant | Butvar ® B-98, a polyvinyl butyral, commercially available from Monsanto Co. | 2 | — | — |
| | Ganex ® P-904, a 2-pyrrolidinone/ ethenyl- polymer with 1-butene, commercially available from GAF Chemicals Corp. | — | 1.6 | — |

TABLE I-continued

Organic Component Formulations*

| Component | Generic Description | Composition A | B | C |
|---|---|---|---|---|
| | Acryloid ® B-82, an acrylic copolymer, commercially available from Rohm and Haas Co. | — | — | 2 |
| Solvent | Ortho-xylene | 45 | 54 | — |
| | ethanol | 30 | 36 | — |
| | toluene | — | — | 78 |
| Plasticizer | PX-316, a mixed normal alkyl-phthalate, commercially available from Aristech Chem Corp. | 7 | 7 | 10 |
| | UCON ® 50-HB-2000, a polyalkylene glycol, commercially available from Union Carbide Corp. | 7 | 7 | — |
| | Paraplex ® G-60, an epoxidized soybean oil, commercially available from C. P. Hall Co. | — | — | 8 |
| | Acryloid ® A-10S, an acrylic copolymer, commercially available from Rohm and Haas Co. | — | — | 6 |
| Binder | Butvar ® B-98 | 11 | 11 | — |
| | Acryloid ® B-82 | — | — | 22 |

*All amount are parts by weight per 200 parts by weight of aluminum nitride powder

TABLE II

| | | Formulations | | | | | |
|---|---|---|---|---|---|---|---|
| Sample Number | Slurry Formu- lation | Parts by Weight of Ceramic and Sintering Aids Component | | | | | |
| | | AlN | $Al_2O_3$ | $CaCO_3$ | $CaF_2$ | $Y_2O_3$ | $YF_3$ |
| S-1 | B | 200 | 1 | 4 | 1 | — | — |
| S-2 | C | 200 | 1 | — | 1 | — | 1 |
| S-3 | C | 200 | 1 | — | — | 1 | 1 |
| S-4 | C | 200 | 1 | 4 | — | 1 | — |
| S-5 | C | 200 | — | — | 2 | — | 2 |
| S-6 | C | 200 | 0.5 | 4 | — | 1 | — |
| S-7 | C | 200 | 1 | — | — | 0.5 | 1.5 |
| S-8 | C | 200 | 3 | 4 | — | 2 | — |
| S-9 | C | 200 | — | 6 | — | — | 6 |
| S-10 | C | 200 | — | — | 2.4 | 2.4 | — |

TABLE III

Thermal Conductivity Measurements*

| Sinter Temperature (°C.) | Sample Number | | | | | | | | | |
|---|---|---|---|---|---|---|---|---|---|---|
| | S-1 | S-2 | S-3 | S-4 | S-5 | S-6 | S-7 | S-8 | S-9 | S-10 |
| 1600 | 119 | 114 | — | — | — | 110 | — | 117 | — | — |
| 1650 | 134 | 131 | 128 | 136 | 125 | 145 | 137 | — | 122 | 117 |
| 1800 | 151 | 163 | — | — | 154 | 167 | — | — | 168 | — |
| 1850 | 168 | — | 156 | 150 | 173 | — | — | 161 | — | — |
| 1900 | 195 | — | — | 187 | — | — | — | — | — | — |

*Watt/Meter °K.
— Not measured

The data presented in Table III demonstrate that AlN can be sintered with sintering aid formulations of the present invention over a temperature range of from 1600° C. to 1900° C. The data also demonstrate that resultant AlN sheets or articles have thermal conductivity values in excess of 100 W/m °K. AlN sheets prepared from formulations similar to those of Table II save for use of only one liquid phase sintering aid normally have at least one of two shortcomings. One shortcoming is an inability to reach high sintered densities at temperatures below 1700° C. A second shortcoming is a thermal conductivity value less than 100 W/m °K. Thermal conductivity values below 100 W/m °K. are also obtained with amounts of $Al_2O_3$ in excess of about 8 wt. %, based upon weight of AlN plus sintering aids. Results similar to those shown in Table III are expected with other combinations of sintering aids and, optionally, $Al_2O_3$ within the limits described herein.

EXAMPLE 2

Refractory metal inks or pastes were prepared in accordance with the formulations listed in Table IV.

TABLE IV

INK FORMULATIONS (PARTS BY WEIGHT)

| | Formulation # | | | | | | |
|---|---|---|---|---|---|---|---|
| Component | I-1 | I-2 | I-3 | I-4 | I-5 | I-6 | I-7 |
| Tungsten | 36.5 | 36.5 | 36 | 33 | 32.5 | 35.5 | 38 |
| Molybdenum | | | | | 3 | | |
| Nickel | 0.5 | 0.5 | 0.5 | 0.5 | | | |
| Cobalt | | | | | 0.5 | 0.5 | |
| Copper | | | | | | | 1 |
| Tungsten Trioxide | | | | 4 | | | |
| Aluminum Oxide | | | 1 | | | | |
| Aluminum Nitride | 0.5 | 0.5 | | | 0.5 | 0.5 | |
| Titanium Nitride | | | | | 1 | 1 | 1 |
| α-Tepineol | 12 | 12 | 12 | 12 | 12 | 12 | 12 |
| Ethyl Cellulose | 0.5 | | 0.5 | 0.5 | 0.5 | | |
| Butvar ® B-98 | | 1 | | | | 1 | 1 |

The refractory metal inks were deposited onto surfaces and into vias of aluminum nitride green tapes prepared as in Example 1 using vacuum-assisted screen printing. The screen printing procedure included two steps. In a first step, the vias were filled. In a second step, the ink was deposited onto the surfaces of the tapes. The ink formulation for via filling contained the same components as that used for deposition on the surfaces. All component amounts were the same except the amount of solvent which was 9.6 parts by weight in the via filling ink. Each ink-coated layer or tape was dried at ambient temperature in air for a period of 20 minutes. The screen printed tapes were then placed in a drying oven set at a temperature of 90° C. for a period of 20 minutes.

After drying, the ink-coated tapes were laminated into a multilayer greenware and placed in a burnout oven to remove organic components from the greenware. Organic component removal or binder burnout followed the procedure described in Example 1. The binder burnout also served to remove organic components from the ink. The laminates were sintered as in Example 1. The conditions used to sinter the aluminum nitride-containing shaped pieces also effectively sintered the refractory metal ink.

Table V includes the sintering temperature and summarizes results of co-sintering trials of various combinations of substrates prepared in accordance with the slip formulations of Example 1 and the ink formulations of Table IV.

TABLE V

| Sample # | Tape Formulation # | Ink Formulation # | Multilayer Laminate | | | | |
|---|---|---|---|---|---|---|---|
| | | | Sinter Temperature (°C.) | Sinter Time (Hours) | Camber (inches/ inch) | Thermal Conductivity Watts/Meter °K. | Metal Resistance (mΩ/□) |
| L-1 | S-1 | I-1 | 1650 | 4 | <0.0020 | 128 | 84 |
| L-2 | S-1 | I-1 | 1850 | 2 | <0.0020 | 149 | 20 |
| L-3 | S-2 | I-1 | 1600 | 4 | <0.0020 | 116 | 66 |
| L-4 | S-2 | I-1 | 1850 | 2 | <0.0020 | 142 | 40 |
| L-5 | S-2 | I-7 | 1650 | 4 | <0.0020 | 130 | 55 |
| L-6 | S-3 | I-3 | 1650 | 4 | <0.0030 | 119 | 78 |
| L-7 | S-4 | I-4 | 1800 | 2 | <0.0030 | 137 | 88 |
| L-8 | S-5 | I-2 | 1800 | 4 | <0.0030 | 132 | 73 |
| L-9 | S-6 | I-5 | 1650 | 4 | <0.0020 | 121 | 52 |
| L-10 | S-7 | I-6 | 1650 | 6 | <0.0030 | 114 | 90 |
| L-11 | S-8 | I-7 | 1650 | 4 | <0.0030 | 108 | 28 |
| L-12 | S-9 | I-7 | 1900 | 1 | <0.0030 | 153 | 47 |
| L-13 | S-10 | I-2 | 1650 | 6 | <0.0030 | 111 | 61 |

The data summarized in Table V demonstrate that pressureless sintering provides suitable co-fired, metallized AlN substrates over a temperature range of from 1600° C. to 1900° C. In other words, all have average camber levels of less than 0.010, thermal conductivities greater than 100 W/m °K. and sheet resistance level below 100 milliohms per square. Co-fired, metallized AlN substrates prepared without the combination of sintering aids specified herein lack one or more of these desired properties. In other words, the latter substrates have, for example, camber values in excess of 0.010.

Similar results are obtained with other combinations of the slip formulations and refractory ink compositions disclosed herein over the temperature range of from 1600° C. to 1900° C.

I claim:

1. A process for preparing a co-fired, multilayer aluminum nitride substrate substantially free of warpage that comprises:

a. preparing at least two ceramic green sheets from a composition containing aluminum nitride, a combination of at least one first liquid phase sintering aid and at least one second liquid phase sintering aid, and, optionally, aluminum oxide, the first and second sintering aids being selected from subgroups 1) oxygen-containing alkaline earth metal compounds, 2) oxygen-containing derivatives of lanthanide series elements, 3) oxygen-containing derivatives of yttrium, 4) alkaline earth metal halides, 5) halogen-containing derivatives of lanthanide series elements and 6) yttrium halides, provided, however, that the first and second sintering aids are selected from different subgroups, the combination of sintering aids being present in an amount sufficient to initiate liquid phase sintering of aluminum nitride at a temperature within a range of from 1400° C. to 1600° C. and substantially complete said liquid phase sintering at a temperature within a range of from 1600° C. to 1900° C.;

b. depositing a desired pattern of conductive metal paste on at least one major planar surface of at least one ceramic green sheet, the metal paste containing a refractory metal, at least one sintering additive selected from nickel, cobalt, chromium, iron, manganese, copper and compounds thereof that are converted to their corresponding metal during sintering, and in the absence of Ti, Hf and Zr, the sintering additives being present in an amount sufficient to initiate liquid phase sintering of the refractory metal at a temperature within a range of from 1400° C. to 1600° C. and substantially complete said liquid phase sintering at a temperature within a range of from 1600° C. to 1900° C.;

c. preparing a laminate of a desired number of ceramic green sheets having conductive metal patters deposited thereon;

d. heating the laminate in a non-oxidizing atmosphere, at atmospheric pressure and at a temperature sufficient to effect liquid phase sintering of both the ceramic sheets and the conductive metal paste deposited on said sheets.

2. A process as claimed in claim 1, wherein aluminum oxide is present in the ceramic green sheets in an amount of from greater than 0 to about 8 percent by weight, based upon weight of aluminum nitride plus sintering aids.

3. A process as claimed in claim 1, wherein the refractory metal component of the conductive metal paste is tungsten, the tungsten having an average particle size of from 0.5 to 1.5 μm.

4. A process as claimed in claim 1, wherein the sintering additive in the metal paste is copper.

5. A process as claimed in claim 1, wherein the liquid phase sintering aids in the ceramic green sheets are calcium fluoride and one of calcium oxide, calcium carbonate and yttrium fluoride.

6. A process as claimed in claim 1, wherein the liquid phase sintering aids in the ceramic green sheets are calcium carbonate and yttrium oxide.

7. A process for preparing a cofired, multilayer aluminum nitride substrate substantially free of warpage that comprises:
   a. preparing at least two ceramic green sheets from a composition containing aluminum nitride as a main component, a combination of at least one first liquid phase sintering aid and at least one second liquid phase sintering aid, and, optionally, aluminum oxide, at least one organic binder, a dispersant, a solvent and, optionally, a plasticizer on lubricant, the composition including from 50 to 70 wt. % of a combination of the aluminum nitride and the liquid phase sintering aids, from 5 to 15 wt. % binder material and from 20 to 45 wt. % solvent, all percentages being based upon composition weight, the first and second sintering aids being selected from subgroups 1) oxygen-containing alkaline earth metal compounds, 2) oxygen-containing compounds of lanthanide series elements, 3) oxygen-containing compounds of yttrium, 4) alkaline earth metal halides, 5) halogen-containing compounds of lanthanide series elements and 6) yttrium halides, provided, however, that the first and second sintering aids are selected from different subgroups, the combination of sintering aids being present in an amount that is from greater than 0 to 10 wt. % of combined weight of aluminum nitride and liquid phase sintering additives and sufficient to initiate liquid phase sintering of aluminum nitride at a temperature within a range of from 1400° C. to 1600° C. and substantially complete said liquid phase sintering at a temperature within a range of from 1600° C. to 1900° C.;
   b. depositing a desired pattern of conductive metal paste on at least one major planar surface of at least one ceramic green sheet, the metal paste containing a refractory metal, at least one sintering additive selected from chromium, manganese, copper and compounds thereof that are converted to their corresponding metal during sintering, and in the absence of Ti, Hf and Zr, the sintering additives being present in a total amount that is from greater than 0 to 10 wt. % of the present components and sufficient to initiate liquid phase sintering of the refractory metal at a temperature within a range of from 1400° C. to 1600° C. and substantially complete said liquid phase sintering at a temperature within a range of from 1600° C. to 1900° C.;
   c. preparing a laminate of a desired number of ceramic green sheets having conductive metal patterns deposited thereon;
   d. heating the laminate in a non-oxidizing atmosphere, at atmospheric pressure and at a temperature that is within a range of from 1600° C. to 1900° C. and sufficient to substantially complete liquid phase sintering of both the ceramic sheets and the conductive metal paste deposited on said sheets.

8. A process as claimed in claim 7, wherein aluminum oxide is present in the ceramic green sheets in an amount of from greater than 0 to about 8 percent by weight, based upon weight of aluminum nitride plus sintering aids.

9. A process as claimed in claim 7, wherein the refractory metal component of the conductive metal paste is tungsten, the tungsten having an average particle size of from 0.5 to 1.5 μm.

10. A process as claimed in claim 7, wherein the sintering additive in the metal paste is copper.

11. A process as claimed in claim 7, wherein the liquid phase sintering additives in the ceramic green sheets are calcium fluoride and one of calcium oxide, calcium carbonate and yttrium fluoride.

12. A process as claimed in claim 7, wherein the liquid phase sintering additives in the ceramic green sheets are calcium carbonate and yttrium oxide.

* * * * *